(12) United States Patent
Eichler et al.

(10) Patent No.: US 10,020,421 B2
(45) Date of Patent: Jul. 10, 2018

(54) OPTOELECTRONIC COMPONENT

(71) Applicant: OSRAM Opto Semiconductors GmbH, Regensburg (DE)

(72) Inventors: Christoph Eichler, Donaustauf (DE); Adrian Stefan Avramescu, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/539,996

(22) PCT Filed: Dec. 29, 2015

(86) PCT No.: PCT/EP2015/081362
§ 371 (c)(1),
(2) Date: Jun. 26, 2017

(87) PCT Pub. No.: WO2016/110433
PCT Pub. Date: Jul. 14, 2016

(65) Prior Publication Data
US 2017/0373220 A1    Dec. 28, 2017

(30) Foreign Application Priority Data
Jan. 5, 2015 (DE) .......................... 10 2015 100 029

(51) Int. Cl.
*H01L 33/06* (2010.01)
*H01L 33/32* (2010.01)

(52) U.S. Cl.
CPC .............. *H01L 33/06* (2013.01); *H01L 33/32* (2013.01)

(58) Field of Classification Search
CPC ................................ H01L 33/06; H01L 33/32
See application file for complete search history.

(56) References Cited

U.S. PATENT DOCUMENTS

| | | |
|---|---|---|
| 6,240,114 B1 | 5/2001 | Anselm et al. |
| 9,553,231 B2 | 1/2017 | Meyer et al. |
| 2002/0053676 A1 | 5/2002 | Kozaki |
| 2005/0067613 A1 | 3/2005 | Kim |
| 2005/0156153 A1 | 7/2005 | Futagawa |
| 2007/0090339 A1 | 4/2007 | Lee et al. |
| 2008/0308787 A1* | 12/2008 | Lee .......................... H01L 33/06 257/13 |

(Continued)

FOREIGN PATENT DOCUMENTS

| | | |
|---|---|---|
| DE | 102012217681 A1 | 3/2014 |
| DE | 102013104351 A1 | 10/2014 |

(Continued)

*Primary Examiner* — Daniel Shook
(74) *Attorney, Agent, or Firm* — Slater Matsil, LLP

(57) ABSTRACT

An optoelectronic component is disclosed. In an embodiment the optoelectronic component includes an active zone configured to produce electromagnetic radiation, wherein the active zone has at least two quantum films, wherein the first quantum film is arranged between a first barrier layer and a second barrier layer, wherein the second quantum film is arranged between the second barrier layer and a last barrier layer, and wherein bandgaps of the first barrier layer and of the second barrier layer are related differently to one another than bandgaps of the second barrier layer and of the last barrier layer.

27 Claims, 10 Drawing Sheets

(56) References Cited

U.S. PATENT DOCUMENTS

| | | |
|---|---|---|
| 2012/0056157 A1 | 3/2012 | Hikosaka et al. |
| 2012/0161102 A1 | 6/2012 | Won |
| 2013/0087761 A1 | 4/2013 | Kimura et al. |
| 2013/0320296 A1 | 12/2013 | Yu et al. |
| 2014/0008607 A1 | 1/2014 | Wang et al. |

FOREIGN PATENT DOCUMENTS

| | | |
|---|---|---|
| JP | 2004087908 A | 3/2004 |
| JP | 2009224370 A | 10/2009 |
| JP | 201067927 A | 3/2010 |
| JP | 201223406 A | 2/2012 |

* cited by examiner

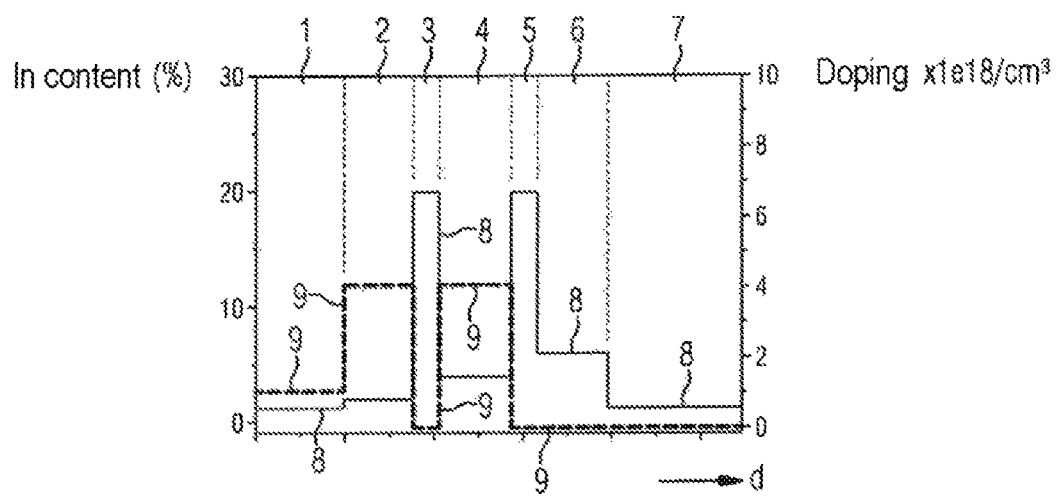

OPTOELECTRONIC COMPONENT

This patent application is a national phase filing under section 371 of PCT/EP2015/081362, filed Dec. 29, 2015, which claims the priority of German patent application 10 2015 100 029.6, filed Jan. 5, 2015, each of which is incorporated herein by reference in its entirety.

TECHNICAL FIELD

The invention relates to an optoelectronic component.

BACKGROUND

The prior art has disclosed optoelectronic components comprising an active zone for producing electromagnetic radiation, wherein the active zone comprises quantum films which are spaced apart from one another by way of barrier layers.

SUMMARY OF THE INVENTION

Embodiments of the invention provide an improved optoelectronic component.

An advantage of the described component lies in the fact that more uniform filling of the quantum films with electrons and holes is obtained. As a result, greater amplification of the optical wave may be achieved. Moreover, absorption by unpumped quantum films is reduced. As a result, the laser threshold drops, wherein the slope of the laser characteristic is improved. Moreover, there is a reduction in the operating current and the efficiency of the optoelectronic component is increased. This facilitates higher output power and a longer service life.

These advantages are obtained by virtue of the optoelectronic component being configured with an active zone for producing electromagnetic radiation, wherein the active zone comprises at least two quantum films, wherein the first quantum film is arranged between a first barrier layer and a second barrier layer, wherein the second quantum film is arranged between the second barrier layer and a last barrier layer, wherein each barrier layer comprises a bandgap, wherein the bandgaps of the first barrier layer and of the second barrier layer are related differently to one another than the bandgaps of the second barrier layer and of the third barrier layer.

In a further embodiment, a bandgap of the first barrier layer and a bandgap of the second barrier layer are of approximately equal magnitude and wherein, in particular, the last barrier layer comprises a larger bandgap than the second barrier layer. This achieves a further improvement in the electro-optical properties.

In a further embodiment, the first barrier layer comprises a larger bandgap than the second barrier layer, wherein the second barrier layer comprises a smaller bandgap than the last barrier layer and wherein the first barrier layer comprises a smaller bandgap than the last barrier layer. This also achieves an improvement in the optoelectronic properties.

In a further embodiment, the second barrier layer comprises a higher doping than the first barrier layer and the last barrier layer and wherein, in particular, the first barrier layer comprises a higher doping than the last barrier layer. This may achieve a further improvement in the optoelectronic properties.

In a further embodiment, the first barrier layer comprises a greater bandgap than the second barrier layer, wherein the second barrier layer comprises a smaller bandgap than the last barrier layer and wherein a bandgap of the first barrier layer comprises the same magnitude as or is larger than a bandgap of the last barrier layer. This achieves an improvement in the optoelectronic properties.

In a further embodiment, the first barrier layer comprises a smaller bandgap than the second barrier layer, wherein the second barrier layer comprises a smaller bandgap than the last barrier layer. This achieves an improvement in the optoelectronic properties.

In a further embodiment, the first barrier layer and/or the second barrier layer comprise/comprises a higher doping than the last barrier layer, wherein, in particular, doping of the first barrier layer and doping of the second barrier layer are of approximately equal magnitude. This achieves a further improvement in the optoelectronic properties.

In a further embodiment, the first barrier layer comprises a smaller bandgap than the second barrier layer.

In a further embodiment, the second barrier layer comprises a smaller bandgap than the last barrier layer.

In a further embodiment, a first barrier layer is arranged at an n-contact side and comprises a smaller bandgap than a second barrier layer. The second barrier layer is arranged between two quantum films. The last barrier layer is arranged on the p-contact side adjacent to the second quantum film.

In one embodiment, the second barrier layer comprises a smaller bandgap than the first barrier layer. This achieves an improvement in the optoelectronic properties.

In a further embodiment, the bandgap of the second barrier layer and the bandgap of the last barrier layer are approximately of equal magnitude. This also facilitates good optoelectronic properties.

In a further embodiment, the last barrier layer comprises a bandgap equal to or smaller than the second barrier layer. This achieves a further improvement in the optoelectronic properties.

In a further embodiment, the bandgap within a barrier layer is configured in a step-like manner or with an increasing value along a thickness of the barrier layer. This may achieve a further optimization of the optoelectronic properties.

In a further embodiment, the bandgap within a barrier layer is configured in a step-like manner or with a decreasing value or an increasing value along a thickness of the barrier layer. This may achieve a further improvement of the optoelectronic properties.

In a further embodiment, the first barrier layer comprises a smaller electrical doping than the second barrier layer. This facilitates a further improvement in the optoelectronic properties.

In a further embodiment, the second barrier layer comprises a higher electrical doping than the last barrier layer. This also improves the optoelectronic properties of the component.

In a further embodiment, the first barrier layer comprises electrical doping equal to or lower than the second barrier layer. This may also achieve a further improvement in the optoelectronic properties of the component.

In a further embodiment, the second barrier layer comprises electrical doping higher than or equal to the last barrier layer. This may achieve a further improvement in the optoelectronic properties.

In a further embodiment, the electrical doping within a barrier layer is configured in a step-like manner or with an increasing value along a thickness of the barrier layer. This may facilitate a further optimization of the optoelectronic properties.

In a further embodiment, the electrical doping is configured with central symmetry in relation to a center of the barrier layer in the form of a decreasing curve in the direction of the edge regions of the barrier layer. This may achieve a further optimization of the optoelectronic properties of the component.

In a further embodiment, the first barrier layer is arranged between a first waveguide layer and the first quantum film. Moreover, the last barrier layer is arranged between the second quantum film and a second waveguide layer. Furthermore, the first waveguide layer has a smaller bandgap than the second waveguide layer. This also achieves a further improvement in the optoelectronic properties.

In a further embodiment, the first barrier layer comprises a larger bandgap than the second barrier layer, wherein the second waveguide layer comprises a smaller bandgap than the last barrier layer. This may also achieve a further improvement in the optoelectronic properties.

In a further embodiment, the second barrier layer comprises a greater thickness than the first barrier layer and/or the last barrier layer. This may also achieve a further improvement in the optoelectronic properties.

In a further embodiment, provision is made of at least one further quantum film between the second quantum film and the last barrier layer. Provision is made of a further second barrier layer between the second quantum film and the further quantum film. The last barrier layer adjoins the further quantum film. In this way, active zones with a plurality of quantum films may also comprise improved optoelectronic properties.

The further second barrier layer may be configured in accordance with the second barrier layer or in accordance with the last barrier layer. Moreover, the further second barrier layer may comprise values in respect of the bandgap and/or the electrical doping which lie between the values of the second barrier layer and the values of the last barrier layer.

Moreover, a plurality of second barrier layers may be provided depending on the selected embodiment, said plurality of second barrier layers being configured in accordance with the second barrier layer or the last barrier layer or said plurality of second barrier layers comprising values in respect of the bandgap and/or the electrical doping which lie between the values of the second barrier layer and the values of the last barrier layer.

BRIEF DESCRIPTION OF THE DRAWINGS

The above-described properties, features and advantages of this invention and the manner in which they are achieved become clearer and more readily understandable in conjunction with the following description of the exemplary embodiments, which are explained in more detail in conjunction with the drawings.

FIG. 19 shows a further embodiment of an optoelectronic component, wherein the last barrier comprises a smaller bandgap than the second barrier and the second barrier comprises a smaller bandgap than the first barrier.

The explanations below relate to optoelectronic components which consist at least in part of a semiconductor material. Examples for the InGaN and InGaAlN material systems are described below. However, the advantages of the described optoelectronic components are not restricted to these material systems; instead, they may also be achieved using other semiconductor materials. An indium concentration or aluminum concentration 8 is depicted by a full line. Positive or negative electrical doping 9 is depicted in the form of a dashed line.

DETAILED DESCRIPTION OF ILLUSTRATIVE EMBODIMENTS

Figure 1:
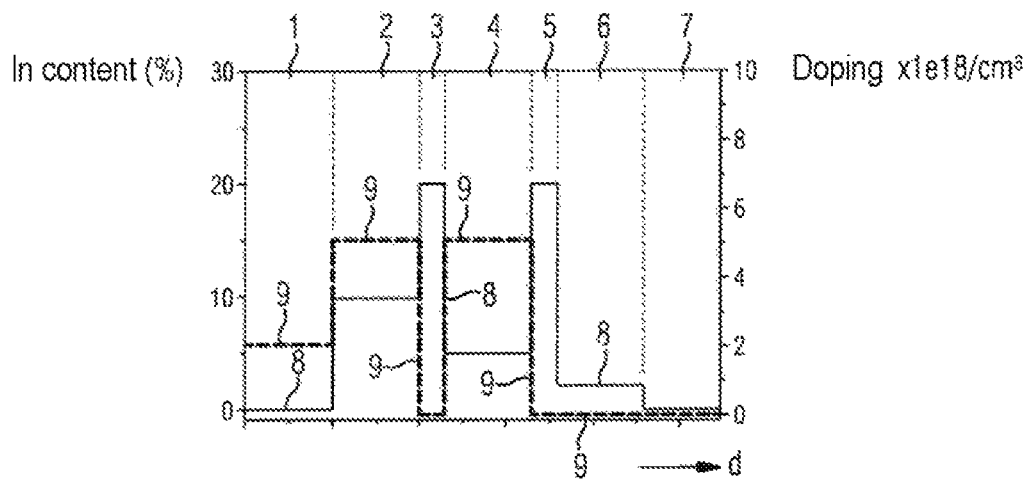
FIGS. 1-6 show various embodiments of an optoelectronic component comprising two quantum films, wherein at least one portion of the component is formed from the InGaN material system, wherein the indium concentration and the electrical doping are plotted over the thickness of the optoelectronic component.

FIG. 1 shows a schematic illustration of a partial section of a layer structure of an optoelectronic component which, in particular, is configured as a semiconductor laser or as a semiconductor diode. The depicted partial section of the component is formed from an InGaN material system, with the In-content varying over the thickness of the component.

Over a thickness of the layer structure, FIG. 1 specifies the concentration 8 of the indium content by way of a full line and the concentration of the electrical doping 9 by way of a dashed line. The indium content is specified as a percentage and the electrical doping is specified in units of $1\times10^{18}/cm^3$. In the InGaN or AlInGaN material system, negative electrical doping is obtained with, e.g., silicon. In the InGaN or AlInGaN material system, positive electrical doping is obtained with, e.g., magnesium. A bandgap between a valence band and a conduction band of the InGaN material system becomes smaller with increasing indium content. The bandgap between a valence band and a conduction band of the AlInGaN material system becomes larger with increasing aluminum content.

The illustration of the layer structure is reproduced schematically; i.e., further or additional layers may be provided between the individual depicted layers. Moreover, only a section of the optoelectronic component is depicted, and so further layers may be provided on both sides of the depicted layer sequence. These explanations also relate to the further FIGS. 2 to 19.

The optoelectronic component comprises a first waveguide layer 1. The first waveguide layer 1 is arranged on an n-contact side. A first barrier layer 2 follows after the first waveguide layer 1. A first quantum film 3 follows the first barrier layer 2. A second barrier layer 4 follows the first quantum film 3. A second quantum film 5 follows the second barrier layer 4. A last barrier layer 6 follows the second quantum film 5. A second waveguide layer 7, which is arranged on a p-side, follows the last barrier layer 6. Depending on the selected embodiment, the depicted layers may directly adjoin one another or further layers may also be arranged between the depicted layers. The layers are plotted over a layer thickness d of the optoelectronic component, wherein the thicknesses of the layers in relation to one another are not depicted true to scale. Moreover, the layers are arranged in such a way that a growth direction, in which the layers are grown on one another, extends from the first waveguide layer 1 in the direction of the second waveguide layer 7.

A concept of the present invention consists of designing the active zone, i.e., the barrier layers 2, 4, 6 of the active zone, asymmetrically in such a way that the at least two quantum films 3, 5 are filled more uniformly with electrons and holes. A higher amplification of the optical wave is facilitated by more uniform filling of the quantum films with electrons and holes, wherein an absorption by unpumped quantum films is reduced. As a result, a lowering of the laser threshold and an improvement of the slope of the laser characteristic are achieved. Moreover, the operating current is reduced and the efficiency of the optoelectronic component is increased. Furthermore, a higher output power is possible, with, at the same time, an extension of the service life. The first barrier layer 2 may have low electrical doping to no doping. Here, for example, the electrical doping of the first barrier layer 2 may be less than $6 \times 10^{18}/cm^3$, for example, less than $2 \times 10^{18}/cm^3$, or less than $1 \times 10^{18}/cm^3$. Moreover, the first barrier layer 2 may have a small bandgap, i.e., a high indium concentration which, for example, lies between 3 and 20%, preferably between 5 and 12%, particularly preferably between 7 and 10%. Furthermore, the thickness of the first barrier layer 2 may lie in the range between 0.5 nm and 20 nm, for example, between 2 nm and 15 nm. Moreover, the thickness of the first barrier layer may also lie between 4 nm and 10 nm.

The second barrier layer 4, which is arranged between the two quantum films 3, 5, may likewise have high electrical doping. Here, the electrical doping may lie between $1 \times 10^{18}/cm^3$ and $3 \times 10^{19}/cm^3$. Furthermore, the electrical doping may lie between 4 and $20 \times 10^{18}/cm^3$. Particularly preferably, the electrical doping of the second barrier 4 may lie between 5 and $10 \times 10^{18}/cm^3$. The second barrier 4 may have a larger bandgap, i.e., less indium, than the first barrier 2. Moreover, the second barrier 4 may have an even larger bandgap, i.e., little to no indium. By way of example, the indium content of the second barrier layer 4 lies below 6%, preferably below 3%, particularly preferably below 0.5%. Moreover, even no indium at all may be present in the second barrier layer 4.

The first barrier layer 2, second barrier layer 4, and last barrier layer 6 are formed from indium gallium nitride or gallium nitride, depending on how high the indium content is in the corresponding barrier layer. The second barrier layer 4 may have a thickness in the range between 0.5 nm and 20 nm, preferably between 4 nm and 15 nm, particularly preferably between 6 nm and 11 nm.

In the last barrier layer 6, the electrical doping may be in the region of less than $2 \times 10^{19}/cm^3$, preferably less than $4 \times 10^{18}/cm^3$, particularly preferably less than $1 \times 10^{18}/cm^3$ or the last barrier layer may be undoped. Moreover, the last barrier layer 6 has a large bandgap, i.e., little to no indium, wherein the indium concentration may lie below 6%, preferably below 3%, particularly preferably below 5% and down to 0% such that the last barrier layer 6 may be constructed from gallium nitride. The thickness of the last barrier layer 6 may lie in the range between 0.5 nm and 20 nm, preferably between 4 nm and 12 nm, particularly preferably between 6 nm and 10 nm.

The electrical doping of the first barrier layer 2, second barrier layer 4, and last barrier layer 6 is n-conducting, wherein, e.g., silicon, oxygen or germanium may be used as dopant. Good optoelectronic properties are achieved by virtue of the first barrier layer 2 comprising a relatively low bandgap, i.e., a relatively high indium concentration, wherein the second barrier layer 4 and the last barrier layer 6 comprise a larger bandgap, i.e., a lower indium concentration or a zero indium concentration. Moreover, the electrical doping of the first barrier layer 2 may be equal to or less than the electrical doping of the second barrier layer 4. Furthermore, the third barrier layer comprises electrical doping which is less than the electrical doping of the second barrier layer and/or of the first barrier layer. Furthermore, the second barrier layer 4 may have, in terms of thickness, a larger configuration than the first barrier layer 2. If provision is made of more than two quantum films 3, 4, the additional barrier layers may be configured in accordance with the second barrier layer 4 in a manner dependent on the selected embodiment.

Moreover, in relation to the indium concentration, the electrical doping, the layer thickness, and/or in relation to an aluminum concentration, the further barrier layers may be configured in accordance with a value between the corresponding values of the second barrier layer 4 and of the last barrier layer 6.

The first waveguide layer 1 comprises no indium. By way of example, the first barrier layer 2 comprises an indium concentration in the region of 10%. The first quantum film 3 comprises an indium concentration in the region of 20%. The second barrier layer 4 comprises an indium concentration lying in the region of 5%. The second quantum film 5 comprises an indium concentration lying in the region of 20%. The last barrier layer 6 comprises an indium concentration lying in the range of 2 to 4%. The second waveguide layer 7 comprises an indium concentration of zero. The first waveguide layer 1 comprises electrical doping lying in the region of $2 \times 10^{18}/cm^3$. The first barrier layer 2 comprises electrical doping lying in the region of $5 \times 10^{18}/cm^3$. The first quantum film 3 comprises no electrical doping. The second barrier layer 4 comprises electrical doping lying in the region of $5 \times 10^{18}/cm^3$. The second quantum film 5 comprises no electrical doping. The last barrier layer 6 comprises no electrical doping. The second waveguide layer 7 is likewise undoped. An improved injection of charge carriers into the quantum films 3, 5 is achieved as a result of the higher indium concentration on the n-side in comparison with the indium concentration of the barriers on the p-side. In particular, the injection is more uniform.

Figure 2:
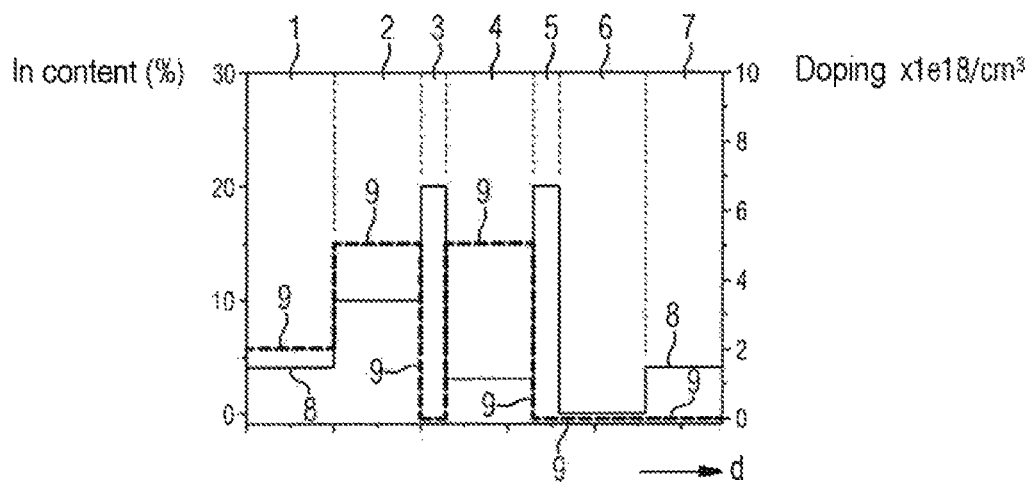

FIG. 2 shows the same layer structure as FIG. 1, wherein, however, the first waveguide layer 1, in contrast to the layer structure of FIG. 1, comprises an indium concentration 8 in the region of 4%. Moreover, the last barrier layer 6 comprises an indium concentration 8 lying in the region of 0%. Furthermore, the second waveguide layer 7 comprises an indium concentration 8 lying in the region of 4%. The indium concentration 8 is depicted using a full line. The electrical doping 9 is depicted in the form of a dashed line. An improved wave guidance is achieved by the provision of indium or by the configuration of the first waveguide layer 1 and the second waveguide layer 7 in the form of indium gallium nitride. The further layers comprise the corresponding structure and the electrical doping in accordance with FIG. 1.

An improved injection of charge carriers, in particular a more uniform injection of charge carriers into the first quantum film 3 and into the second quantum film 5, is also achieved in this embodiment as a result of a smaller bandgap, i.e., a higher indium concentration, in the first barrier layer 1 in comparison with the second barrier layer 4 and the third barrier layer 6.

Figure 3:
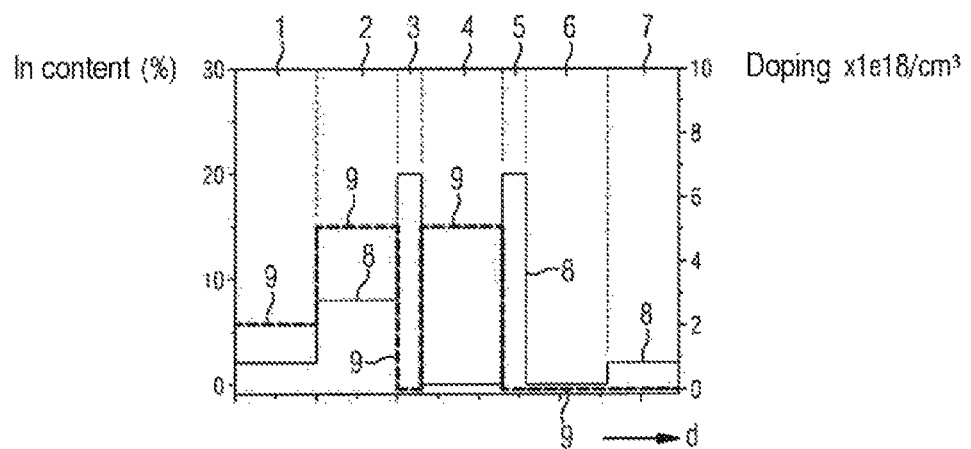

FIG. 3 shows a further embodiment of the optoelectronic component, wherein the electrical doping 9 of the layers is configured in accordance with FIGS. 1 and 2, wherein, however, the first waveguide layer 1, in comparison with FIG. 2, comprises an indium concentration 8 in the region of 2%. Moreover, the second barrier layer 4 comprises no indium. Likewise, the last barrier layer 6 comprises no indium. The indium concentration 8 of the first barrier layer 2 lies in the region of 8%. Moreover, the indium concentration 8 of the second waveguide layer 7 likewise lies in the region of 2%. In this embodiment, the first barrier layer 2 is formed from indium gallium nitride and the second barrier layer 4 and the last barrier layer 6 are formed from gallium nitride. This also achieves an improved injection or a more uniform injection of charge carriers into the quantum films 3, 5. As a result of configuring the waveguides 1, 7 with indium gallium nitride, an improved wave guidance of the optical mode is facilitated.

Figure 4:
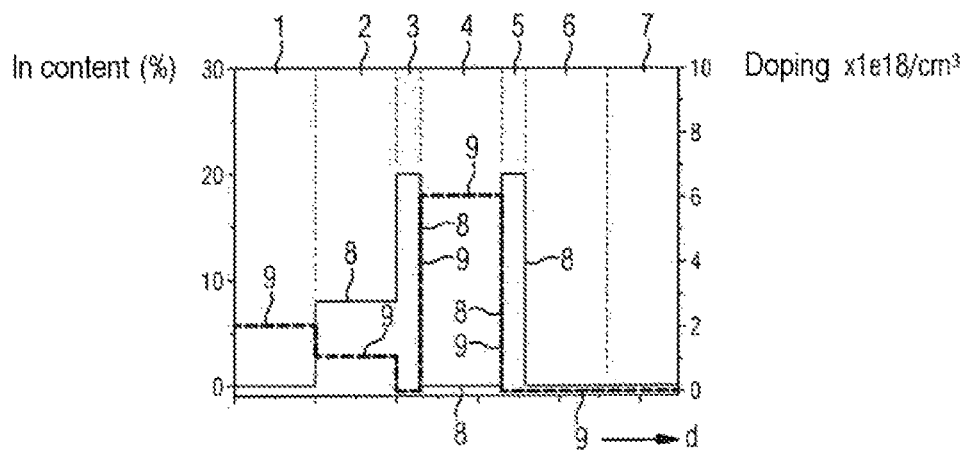

FIG. 4 shows a further embodiment of an optoelectronic component, wherein the indium concentration 8 of the first barrier layer 2, of the first quantum film 3, of the second barrier layer 4, and of the last barrier layer 6 is configured in accordance with FIG. 3. In contrast to FIG. 3, the first waveguide layer 1 and the second waveguide layer 7 comprise no indium. Moreover, the electrical doping 9 in relation to the embodiment of FIG. 3 comprises a lower configuration for the first barrier layer and lies in the region of 2 to $3\times10^{18}/cm^3$. Moreover, the doping 9 of the second barrier layer 4 lies at $5-6\times10^{18}/cm^3$. Hence, a lower doping is present in the first barrier layer 2, wherein the second barrier layer 4 comprises a higher or high doping. This achieves an improved charge carrier distribution between the quantum films 3, 5.

Figure 5:
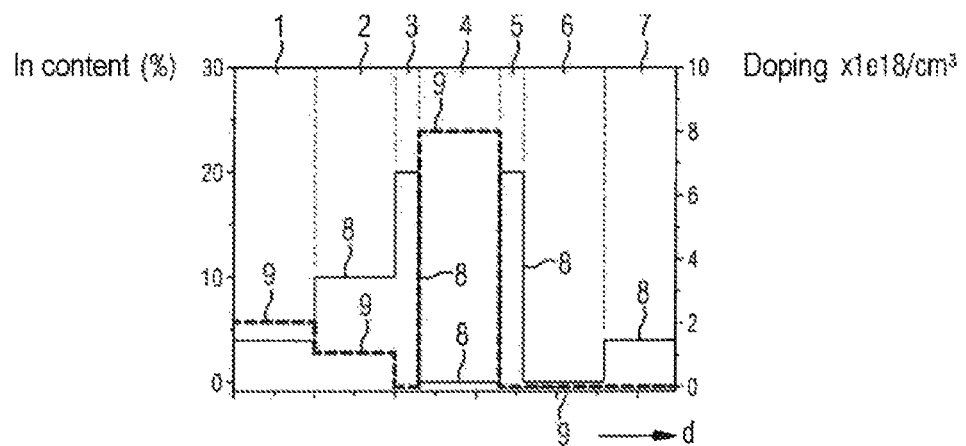

FIG. 5 shows an embodiment of an optoelectronic component which substantially corresponds to the embodiment of FIG. 4, wherein, however, the first waveguide layer 1 and the second waveguide layer 7, in contrast to the embodiment of FIG. 4, are configured with indium gallium nitride, wherein the indium concentration 8 in the first waveguide layer lies in the region of 4% and the indium concentration 8 of the second waveguide layer 7 likewise lies in the region of 4%. The electrical dopings 9 of the first waveguide layer 1 and of the second waveguide layer 7 correspond to the electrical doping 9 of the embodiment of FIG. 4. Moreover, the electrical doping 9 of the second barrier layer 4 is higher than in the embodiment of FIG. 4 and lies in the region of $8\times10^{18}/cm^3$. Moreover, a low electrical doping 9 of the first barrier layer 2 in the region of $2\times10^{18}/cm^3$ is once again present, wherein the second barrier layer 4 comprises a very high electrical doping in the region of $8\times10^{18}/cm^3$. As a result, a further improvement is achieved in the charge carrier distribution between the quantum films 3, 5.

Figure 6:
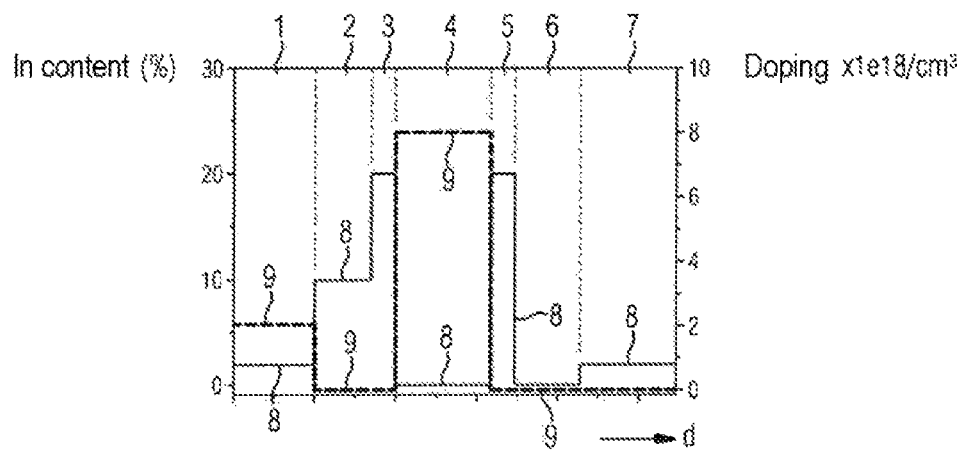

FIG. 6 shows a further embodiment of an optoelectronic component, wherein the first barrier layer 2 comprises a low electrical doping or no electrical doping 9. The electrical doping lies below $1\times10^{18}/cm^3$. The electrical doping of the second barrier layer 4 lies at higher than $7\times10^{18}/cm^3$. In the depicted example, the electrical doping 9 of the second barrier layer 4 lies in the region of $8\times10^{18}/cm^3$. The first waveguide layer 1 and the second waveguide layer 7 are configured with indium gallium nitride and comprise an indium concentration 8 in the region of 2%. Furthermore, the second barrier layer 4 has a thicker configuration than the first barrier layer 2 and/or the last barrier layer 6. By way of example, the second barrier layer 4 may comprise a thickness which is thicker than the first barrier layer and/or the last barrier layer by 5%, preferably by 10%, in particular by 20% or more. Improved high-temperature properties of the component are achieved in this manner.

Figure 7:
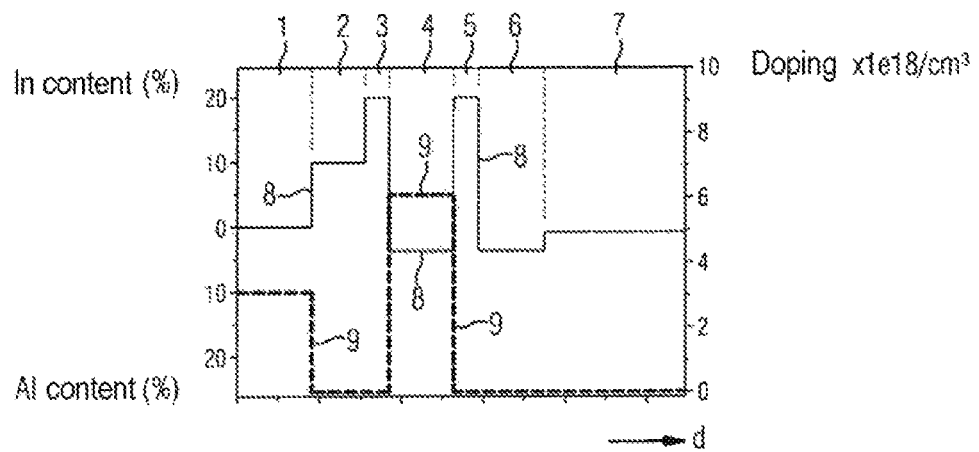
FIGS. 7-8 show further embodiments of an optoelectronic component comprising two quantum films, wherein at least one portion of the component is formed from the InGaAlN material system and wherein an indium concentration and an aluminum concentration and electrical doping are plotted over the thickness of a portion of the optoelectronic component.

FIG. 7 shows a schematic illustration of an optoelectronic component which is constructed from the AlInGaN material system in the depicted partial section, wherein the individual layers comprise indium and/or aluminum. The indium or aluminum concentration is depicted in such a way that, proceeding from the value 0, the indium content is depicted in the upward direction and, proceeding from the value 0, the aluminum content is depicted in the downward direction by way of the full line 8. Moreover, the electrical doping 9 for the individual layers is specified.

The first barrier layer 2 comprises a high indium concentration in the region of 10%. The second barrier layer 4 and the last barrier layer 6 comprise an aluminum concentration in the region of 2.5%. That is to say, the second barrier layer 4 and the last barrier layer 6 are formed from aluminum gallium nitride. This achieves an improved charge carrier injection. The first waveguide layer 1 comprises no indium and consists of gallium nitride. The first quantum film 3 comprises an indium concentration in the region of 20%. The second quantum film 5 comprises an indium concentration in the region of 20%. The second waveguide layer 7 comprises neither aluminum nor indium. The first waveguide layer comprises doping in the region of $3\times10^{18}/cm^3$. The first barrier layer and the first quantum film 3 have virtually no electrical doping. The second barrier layer 4 comprises doping in the region of $6\times10^{18}/cm^3$. The second quantum film 5, the last barrier layer 6 and the second waveguide layer 7 have low or no electrical doping.

Figure 8:
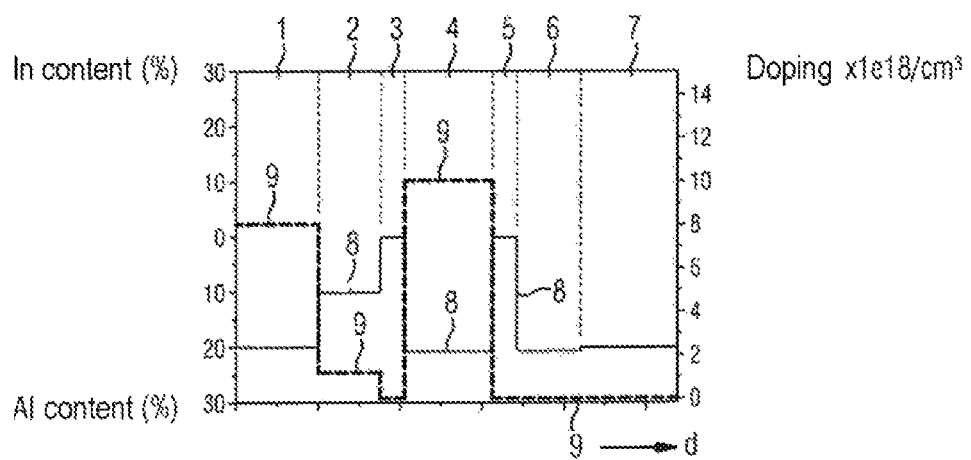

FIG. 8 shows a further embodiment of an optoelectronic component which is formed from the AlInGaN material system in the depicted partial section, wherein the first waveguide layer 1 consists of aluminum gallium nitride and comprises a concentration of 20% aluminum. The first barrier layer 2 likewise consists of aluminum gallium nitride and comprises a concentration of 10% aluminum. The first quantum film 3 is formed from gallium nitride. The second quantum film 5 is likewise formed from gallium nitride. The second barrier layer 4 comprises aluminum gallium nitride, wherein the aluminum content lies in the region of 20%. The last barrier layer 6 likewise comprises aluminum gallium nitride, wherein the aluminum content lies at 20%. The second waveguide layer 7 likewise comprises aluminum gallium nitride, wherein the aluminum content lies in the region of 19%. The first waveguide layer 1 comprises electrical doping in the region of $8\times10^{18}/cm^3$. The first barrier layer 2 has a low doping, lying in the region of $1\times10^{18}/cm^3$ or less. The first quantum film 3 and the second quantum film 5 have substantially no electrical doping. The second barrier layer 4 comprises electrical doping lying in the region of $1\times10^{18}/cm^3$. The last barrier layer 6 and the second waveguide layer 7 have low or no electrical doping. By way of example, this embodiment is suitable for configuring an ultraviolet semiconductor laser with gallium nitride quantum films. The n-side first barrier layer 2 comprises little aluminum; the second barrier layer 4 and the last barrier layer 6 comprise a higher aluminum concentration. This facilitates an improved injection of charge carriers, in particular a uniform injection of charge carriers, in the first quantum film and in the second quantum film. Moreover, an improved charge carrier distribution in the quantum films 3, 5 is achieved by the low to no doping of the first barrier layer 2 and by the high doping in the second barrier layer 4.

Figure 9:
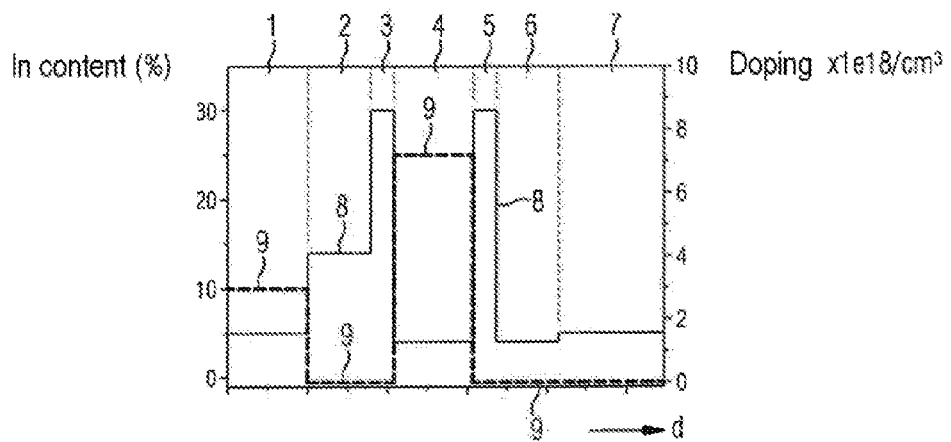
FIG. 9 shows a further embodiment of an optoelectronic component.

FIG. 9 shows a further embodiment of an optoelectronic component which, for example, is suitable for configuring a green semiconductor laser with indium gallium nitride barriers. The first waveguide layer 1 comprises indium gallium nitride, wherein the indium content lies in the region of 5%. The first barrier layer 2 comprises indium gallium nitride, wherein the indium content lies at 15%. The first quantum film 3 comprises indium gallium nitride, wherein the indium content lies at 30%. The second barrier layer 4 comprises indium gallium nitride, wherein the indium content lies at 5%. The second quantum film 5 comprises indium gallium nitride, wherein the indium content lies at 30%. The last barrier layer 6 comprises indium gallium nitride, wherein the indium content lies at 5%. The second waveguide layer 7 comprises indium gallium nitride, wherein the indium content lies at 6%. Furthermore, the first waveguide layer 1 comprises electrical doping in the region of $3\times10^{18}/cm^3$, the first barrier layer 2 comprises low or no doping, just like the first quantum film 3. The second barrier layer 4 comprises electrical doping in the region of $7\times10^{18}/cm^3$. The second quantum film 5, the last barrier layer 6 and the second waveguide layer 7 have low or no electrical doping. An improved injection of charge carriers is facilitated as a result of configuring the n-side first barrier layer 2 with a high indium content and the central barrier layer 4 and the last barrier layer 6 with indium gallium nitride with a lower indium content than the first barrier layer 2. Moreover, low to no doping of the first barrier layer 2 and higher to high doping of the second barrier layer 4 ensures an improved charge carrier distribution between the quantum films 3, 5.

Figure 10:
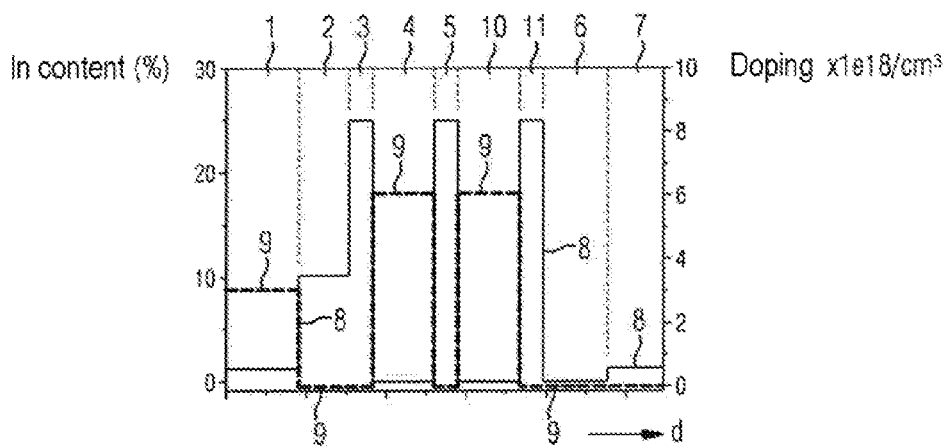
FIG. 10 shows a schematic illustration of a curve of an indium concentration and of electrical doping of an optoelectronic component comprising three quantum films.

FIG. 10 shows a further embodiment of an optoelectronic component which substantially has the same configuration as the embodiment of FIG. 9, wherein, however, provision is made of a further, second barrier layer 10 and a third quantum film 11. The further second barrier layer 10 is arranged between the second quantum film 5 and the third quantum film 11. The last barrier layer 6 follows the third quantum film 11. The further second barrier layer 10 comprises substantially the same configuration as the second barrier layer 4. Depending on the selected embodiment, the further second barrier layer 10 may also have a different configuration to the second barrier layer 4. In respect of the indium concentration and/or the aluminum concentration and/or electrical doping, the further second barrier layer 10 may comprise values like the second barrier layer 4 or values between the values of the second barrier layer 4 and the values of the last barrier layer 6. The indium content of the first waveguide layer flies in the region of 1%, just like the indium content of the second waveguide layer 7. The indium content of the first barrier layer 2 lies in the region of 10%. The indium content of the second barrier layer 4, the further second barrier layer 10 and the last barrier layer 6 lies in the region of 0%. Configuring the n-side first barrier layer 2 with much indium and the remaining barrier layers with little indium, in particular only with gallium nitride, ensures an improved injection of charge carriers. Moreover, low to no doping of the first barrier layer 2 and higher, in particular high, doping of the second barrier layer 4 and the further second barrier layer 10 obtains an improved charge carrier distribution between the quantum films 3, 5, 11. Configuring the first waveguide layer and the second waveguide layer with indium gallium nitride ensures an improved wave guidance.

A corresponding arrangement in accordance with FIG. 10 may also comprise more than three quantum films and further second barrier layers. Here, the further second barrier layers may be configured in accordance with the further second barrier layer 10.

Figure 11:
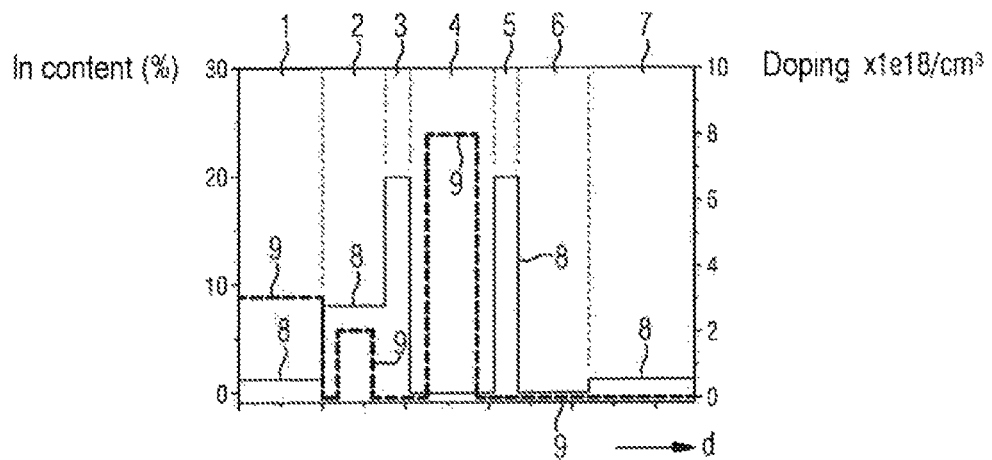
FIGS. 11-15 show further embodiments of an optoelectronic component comprising two quantum films.

FIG. 11 shows a further embodiment, in which the first waveguide layer 1 comprises an indium concentration 8 in the region of 1%, the first barrier layer 2 comprises an indium concentration in the region of 9%, the first quantum film 3 comprises an indium concentration in the region of 20%, the second barrier layer 4 comprises an indium concentration of 0%, the second quantum film 5 comprises an indium concentration of 20%, the last barrier layer 6 comprises an indium concentration of 0%, and the second waveguide layer 7 comprises an indium concentration of 1%. Moreover, the first waveguide layer 1 comprises electrical doping 8 in the region of $3\times10^{18}/cm^3$, and the first quantum film 3, the second quantum film 5, the last barrier layer 6 and the second waveguide layer 7 comprise low or no electrical doping 8. Moreover, the first barrier layer 2 comprises electrical doping in the region of $2\times10^{18}/cm^3$, wherein the electrical doping is arranged with central symmetry in relation to a center of the first barrier layer 2 and falls to the value 0 at a predetermined distance from the edge regions of the first barrier layer 2. The second barrier layer 4 comprises doping in the region of $8\times10^{18}/cm^3$.

In this embodiment, the electrical doping in the second barrier layer 4 is arranged with central symmetry in relation to a center of the second barrier layer 4, wherein the electrical doping falls to the value 0 at a set distance from the edge regions of the second barrier layer 4. Instead of a step-like drop in the electrical doping, provision may also be made of a curve for the decrease of the electrical doping in the direction of the edge region of the first barrier layer 2 or the second barrier layer 4. An improved injection of charge carriers is obtained by the configuration of the n-side first barrier layer 2 with a high indium concentration and the configuration of the second barrier layer 4 and the last barrier layer 6 with gallium nitride. Moreover, the low to no doping of the first barrier layer 2, high doping of the second barrier layer 4 with the centrally symmetric curve distribution of the doping ensures an improved charge carrier distribution. Moreover, the second barrier layer 4 may comprise a greater thickness than the first barrier layer and/or the last barrier layer 6. This facilitates an improved high-temperature property of the component.

Figure 12:
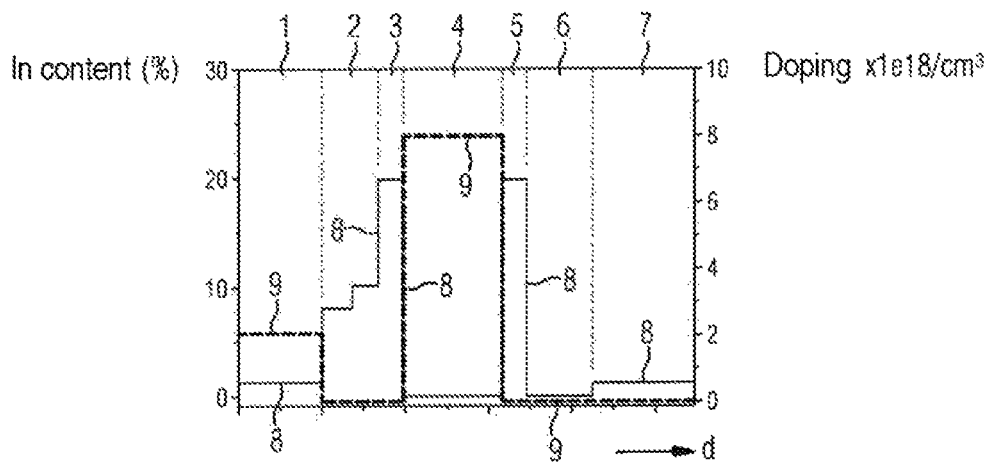

FIG. 12 shows a further embodiment of an optoelectronic component. The first waveguide layer 1 comprises a low indium concentration 8 in the region of 1%. The first barrier layer 2 comprises an indium concentration which increases in a step-like manner in the direction of the first quantum film 3 from a region of 8% to 10%. The first quantum film 3 comprises an indium concentration of 20%. The second barrier layer 4 and the last barrier layer 6 comprise no indium but are formed, instead, from gallium nitride. The second quantum film 5 comprises an indium concentration in the region of 20%. The second waveguide layer 7 comprises a low indium concentration in the region of 1%. Moreover, the first waveguide layer 1 comprises electrical doping 9 in the region of $2\times10^{18}/cm^3$. The first barrier layer 2 has low or no electrical doping. The same applies to the first quantum film 3 and the second quantum film 5. The second barrier layer 4 comprises electrical doping lying in the region of $8\times10^{18}/cm^3$. An improved injection of charge carriers is obtained since the n-side first barrier layer 2 has a multi-step configuration with a high indium concentration and the second barrier layer 4 and the last barrier layer 6 consist of gallium nitride. An improved charge carrier distribution is facilitated by low to no doping in the first barrier layer 2 and a high electrical doping in the second barrier layer 4. Moreover, an improved high-temperature property of the component is facilitated by a thicker configuration of the second barrier layer 4 in comparison with the first barrier layer and last barrier layer 6.

Figure 13:
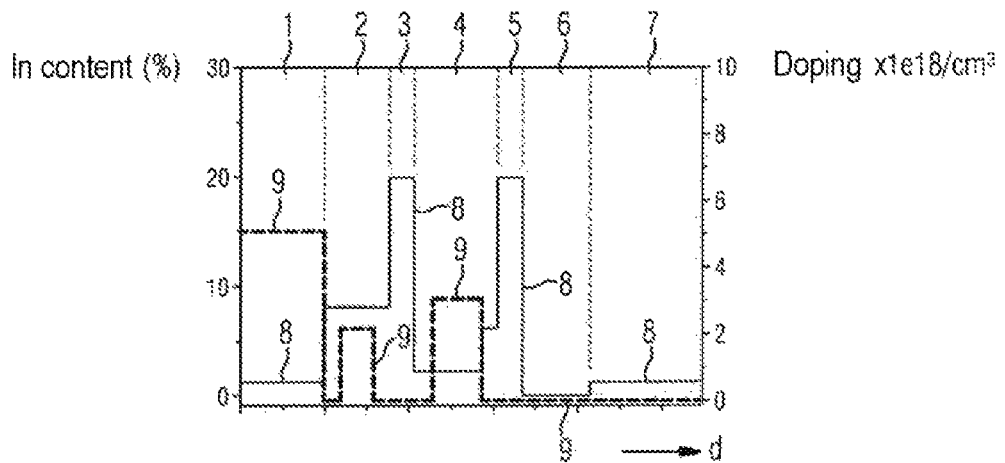

FIG. 13 shows a further embodiment of an optoelectronic component, wherein the first waveguide layer 1 comprises a low indium concentration 8 in the region of 1% and is formed from indium gallium nitride. The first barrier layer 2 is likewise formed from indium gallium nitride, wherein the indium content lies in the region of 9%. The quantum films 3, 5 each comprise indium gallium nitride, wherein the indium content lies in the region of 20%. The second barrier layer 4 comprises an indium content 8 in the region of 3 to 8%, wherein the indium content increases in a step-like manner in the direction of the second quantum film 5. The last barrier layer 6 comprises a low or no indium content and is formed, for example, from gallium nitride. The second waveguide layer 7 is formed from indium gallium nitride with a low indium component of 1%. The first waveguide layer 1 comprises electrical doping in the region of $5\times10^{18}/cm^3$. The first barrier layer 2 comprises electrical doping 9 in the region of $2\times10^{18}/cm^3$. The electrical doping 9 is configured in the form of a curve with central symmetry in relation to a central axis of the first barrier layer 2, wherein the electrical doping falls to the value 0 at a set distance from the edge regions of the first barrier layer 2. The first quantum film 3 and the second quantum film 5 comprise no electrical doping. The second barrier layer 4 comprises electrical doping lying in the region of $3\times10^{18}/cm^3$.

In the depicted embodiment, the electrical doping of the second barrier layer 4 likewise has a configuration with central symmetry in relation to a central axis of the second barrier layer 4, wherein the electrical doping 9 falls to the value 0 in the direction of the edge regions of the second barrier layer 4 and before reaching the edge region. The last barrier layer 6 and the second waveguide layer 7 comprise low or no electrical doping. An improved injection of charge carriers is facilitated since the n-side first barrier layer 2 comprises a high indium concentration in the region of 9% and the second barrier layer 4 comprises a lower indium concentration which, however, increases with at least one step, or with multiple steps, in the direction of the second quantum film 5, and since the last barrier layer 6 consists of gallium nitride. Moreover, the low or no electrical doping 9 in the region of the first barrier layer 2 and higher electrical doping 9 in the region of the second barrier layer 4 facilitates an improved charge carrier distribution.

Figure 14:
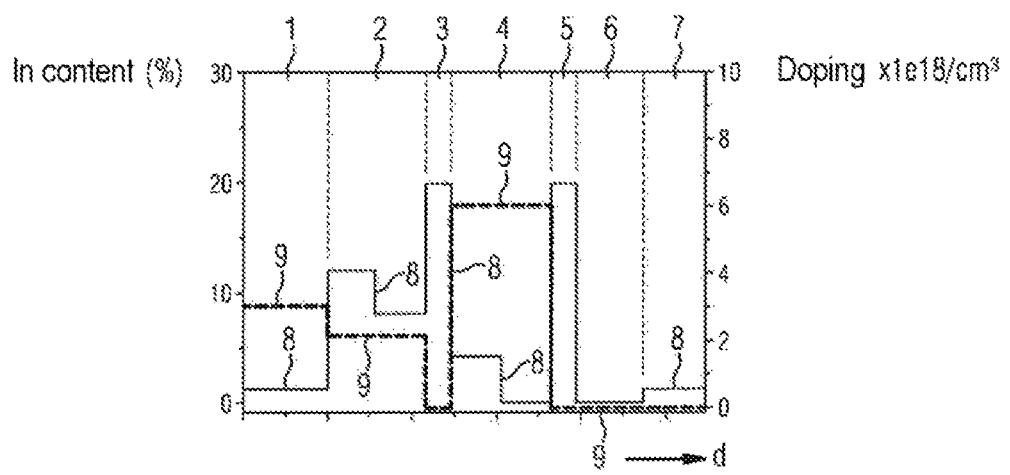

FIG. 14 shows a further embodiment of an optoelectronic component, wherein the first barrier layer 2 and the second barrier layer 4 comprise an indium content 8 which reduces in the direction of the p-side. Moreover, the p-side last barrier layer 6 is formed from gallium nitride. In the depicted exemplary embodiment, the indium content falls in at least one step, or in multiple steps, within the first barrier layer 2 and/or second barrier layer 4. Depending on the selected embodiment, the indium content may also decrease continuously within the barrier layer 2, 4 in the direction of the p-side. This facilitates an improved injection of charge carriers. Moreover, in comparison with the second barrier layer 4, the first barrier layer 2 comprises lower electrical doping 9 in the region of $2\times10^{18}/cm^3$. The second barrier layer 4 comprises electrical doping in the region of $6\times10^{18}/cm^3$. As a result, an improved charge carrier distribution between the quantum films 3, 5 is achieved. The indium content falls from 12% to 8% within the first barrier layer 2. The indium content falls from 5% to 1% or to 0% within the second barrier layer 4. The electrical doping of the second barrier layer 4 lies in the region of $6\times10^{18}/cm^3$. The electrical doping of the first barrier layer 2 lies in the region of $2\times10^{18}/cm^3$.

Figure 15:
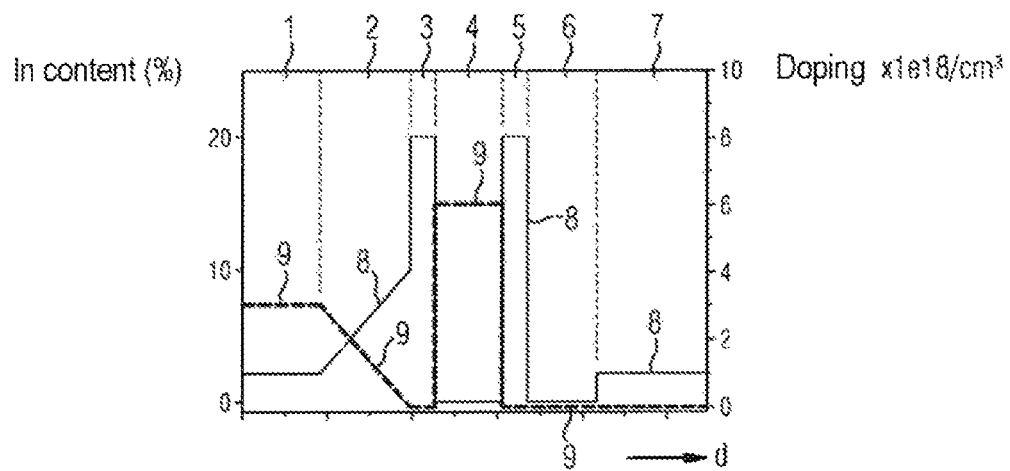

FIG. 15 shows a further embodiment of an optoelectronic component, in which the indium content 8 within the first barrier layer 2, proceeding from the first waveguide layer 1, continuously increases in the direction of the first quantum film 3. The indium content increases from 2% to 10% in the depicted exemplary embodiment. At the same time, the electrical doping 9 falls from $3\times10^{18}/cm^3$ to a value of 0 within the first barrier layer 2. In the depicted exemplary embodiment, the indium concentration in the second barrier layer 4 is less than 2%, in particular 0%. Likewise, the indium concentration in the last barrier layer 6 is below 2%, in particular at 0%. Hence, the second barrier layer 4 and the last barrier layer 6 are preferably formed from gallium nitride. The electrical doping of the first waveguide layer flies in the region of $3\times10^{18}/cm^3$. The electrical doping of the first quantum film 3, of the second quantum film 5, of the last barrier layer 6, and of the second waveguide layer 7 lies in the region of 0.

Depending on the selected embodiment, the indium concentrations, the aluminum concentrations, electrical conductivity may increase or decrease in the form of steps or increase or decrease in the form of continuous curves within one layer.

Even though the invention was illustrated more closely and described in detail by the preferred exemplary embodiment, the invention is not restricted by the disclosed examples and other variations may be derived herefrom by a person skilled in the art, without departing from the scope of protection of the invention.

Figure 16:
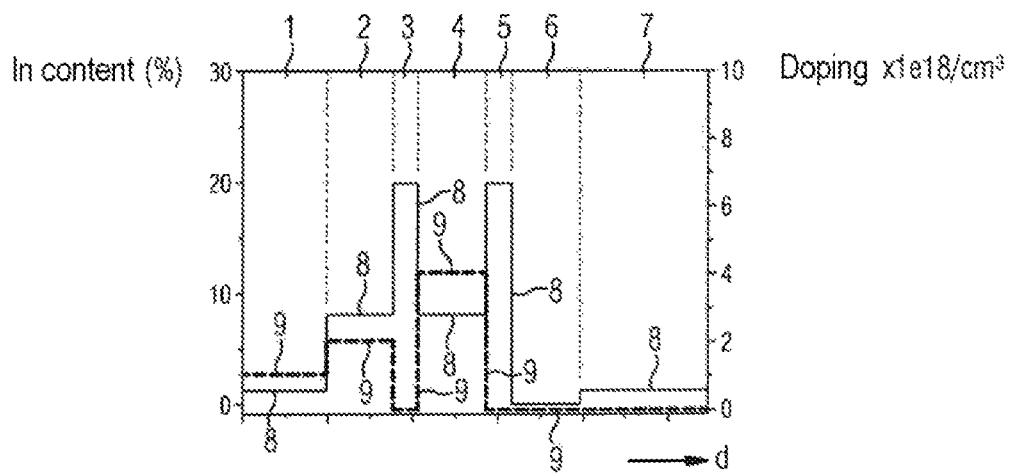
FIG. 16 shows a further embodiment of a partial section of an optoelectronic component, wherein a bandgap of the first barrier layer and a bandgap of the second barrier layer are of approximately equal magnitude.

In a schematic illustration, FIG. 16 shows a partial section of a further embodiment of an optoelectronic component which consists of a semiconductor material, in particular of InGaN or AlInGaN in the depicted partial section, comprising an active zone for producing electromagnetic radiation, wherein the active zone comprises a first waveguide layer 1, wherein a first barrier layer 2 adjoins the first waveguide layer 1. Moreover, provision is made of a second barrier layer 4 and a last barrier layer 6. A first quantum film 3 is arranged between the first barrier layer 2 and the second barrier layer 4. A second quantum film 5 is arranged between the second barrier layer 4 and the last barrier layer 6. A second waveguide layer 7 adjoins the last barrier layer 6. The depicted region of the optoelectronic component is formed from indium gallium nitride or gallium nitride. In the depicted diagram, the indium content 8 is plotted as a full line over the thickness of the component. Moreover, the electrical doping 9 is plotted over the thickness of the component by way of a dashed line. The first waveguide layer 1 is assigned to an n-doped side of the component. The second waveguide layer 7 is assigned to a p-doped side of the component. In the depicted exemplary embodiment, the first barrier layer 2 and the second barrier layer 4 comprise a high indium concentration in the region of 8%, wherein the indium concentrations of the first waveguide layer 2 and the second waveguide layer 4 are of approximately the same magnitude. As a result, the first barrier layer 2 and the second barrier layer 4 comprise a relatively small bandgap between the conduction band and the valence band. The last barrier 6, which constitutes a p-side barrier, comprises a lower indium concentration and hence a greater bandgap than the second barrier layer 4 and/or the first barrier layer 2. Depending on the selected embodiment, the last barrier layer 6, as depicted in FIG. 16, may also consist of gallium nitride. An improved charge carrier injection is achieved by this selection of the bandgaps. Depending on the selected embodiment, the second barrier layer 4 may also comprise a higher indium concentration than the first barrier layer 2, that is to say comprise a smaller bandgap than the first barrier layer 2. This moreover achieves an improvement in the injection of the charge carriers. Moreover, the first waveguide layer 1 and/or the second waveguide layer 7 comprise an indium concentration and are formed from indium gallium nitride. As a result, the first waveguide layer 1 and/or the second waveguide layer 7 comprise a smaller bandgap than gallium nitride and may therefore bring about an improved wave guidance of the electromagnetic radiation. In the depicted exemplary embodiment, the first waveguide layer 1 comprises doping in the region of $1 \times 10^{18}/cm^3$. The first barrier layer 2 comprises doping in the region of $2 \times 10^{18}/cm^3$. The first quantum film 3 and the second quantum film 5 are substantially undoped. The second barrier layer 4 comprises doping in the region of $4 \times 10^{18}/cm^3$. The last barrier layer 6 and the second waveguide layer 7 are undoped.

Figure 17:
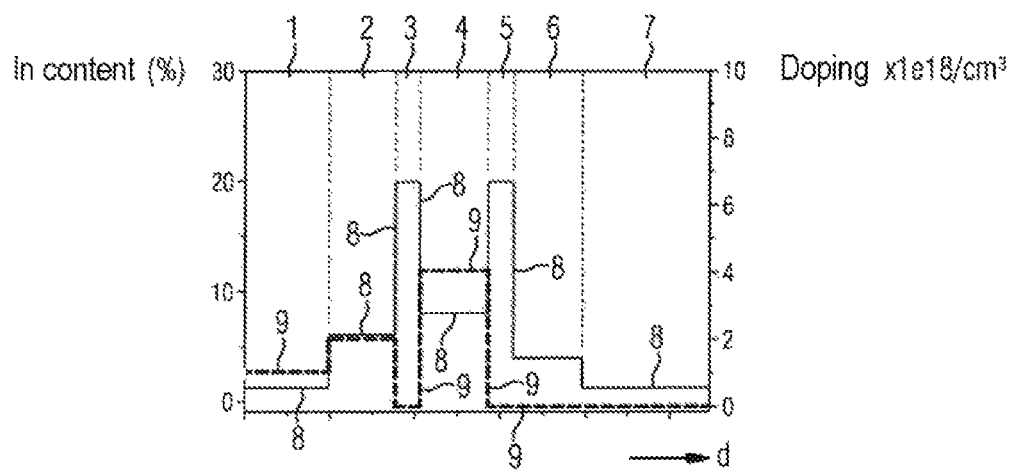
FIG. 17 shows a further embodiment of a component, wherein the second barrier layer comprises a smaller bandgap than the first barrier layer and the last barrier layer.

FIG. 17 shows a partial section of a further embodiment of an optoelectronic component, which is formed from a semiconductor material, in particular from InGaN or AlInGaN. The component comprises a layer sequence of a first waveguide layer 1, a first barrier layer 2, a first quantum film 3, a second barrier layer 4, a second quantum film 5, a last barrier layer 6, and a second waveguide layer 7. In the depicted exemplary embodiment, the central barrier layer 4, i.e., the second barrier layer 4, comprises a smaller bandgap than the first barrier layer 2 or the last barrier layer 3. This is achieved by virtue of the indium concentration being greater in the second barrier layer 4 than in the first barrier layer 2 or in the last barrier layer 6. Moreover, the exemplary embodiment is selected in such a way that the first barrier layer 6 comprises a smaller bandgap than the last barrier layer 6. This is achieved by virtue of the indium content of the first barrier layer 2 being greater than the indium content of the last barrier layer 6. Moreover, the first waveguide layer 1 and the second waveguide layer 7 are formed from indium gallium nitride in the depicted exemplary embodiment. The first waveguide layer 7 comprises an indium concentration in the region of 1%. The first barrier layer 2 comprises an indium concentration in the region of 6%. The second barrier layer 4 comprises an indium concentration in the region of 8%. The third barrier layer 6 comprises an indium concentration in the region of 4%. The second waveguide layer 7 comprises an indium concentration in the region of 1%. The first quantum film 3 and the second quantum film 5 comprise an indium concentration in the region of 20%. Overall, an improved injection is obtained as a result of this selection of the bandgaps in the barrier layers 2, 4, 6. Moreover, the waveguide guidance is improved by virtue of the waveguides consisting of indium gallium nitride.

The first waveguide layer 1 comprises electrical doping in the region of $1 \times 10^{18}/cm^3$. The first barrier layer 2 comprises doping in the region of $2 \times 10^{18}/cm^3$. The second barrier layer 4 comprises doping in the region of $4 \times 10^{18}/cm^3$. The first quantum film 3, the second quantum film 5, the last barrier layer 6 and the second waveguide layer 7 are undoped in the depicted exemplary embodiment.

Figure 18:
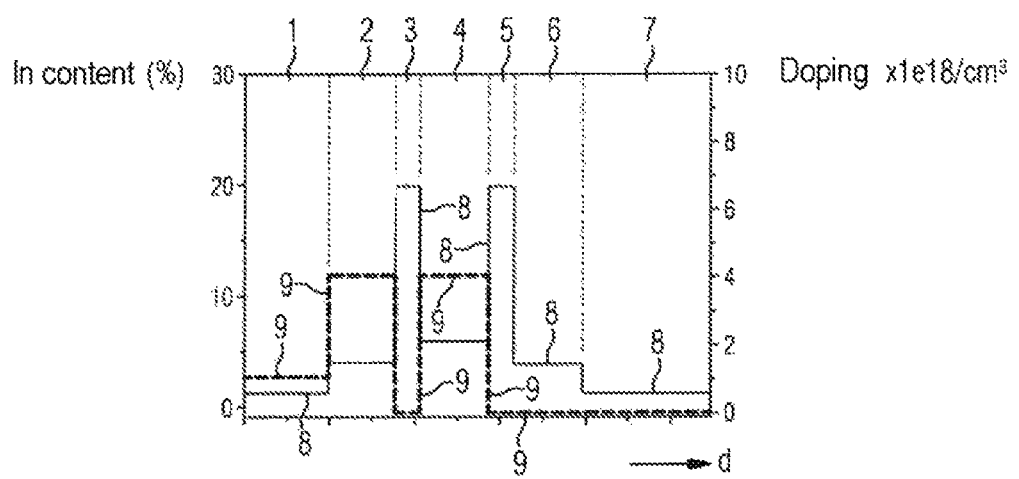
FIG. 18 shows a further embodiment of an optoelectronic component, wherein doping of the first barrier layer and doping of the second barrier layer are of approximately equal magnitude.

FIG. 18 shows a schematic section in a further embodiment of an optoelectronic component formed from a semiconductor material, in particular from InGaN or AlInGaN. The component comprises the following layer structure: a first waveguide layer 1, a first barrier layer 2, a first quantum film 3, a second barrier layer 4, a second quantum film 5, a last barrier layer 6, and a second waveguide layer 7. In the depicted exemplary embodiment, the second barrier layer 4 comprises a smaller bandgap than the first barrier layer 2 and the last barrier layer 6. A bandgap of the first barrier layer 2 and bandgap of the last barrier layer 6 are of approximately equal magnitude. The barrier layers are formed from indium gallium nitride, wherein the indium concentration of the second barrier layer 4 lies in the region of 5%. The indium concentrations of the first barrier layer 2 and of the last barrier layer 6 lie in the region of 4%. The quantum films 3, 5 comprise an indium concentration in the region of 20%. The quantum films are also formed from indium gallium nitride. Moreover, the first and the second waveguide layer 1, 7 are formed from indium gallium nitride, wherein the indium content lies at 1%. Furthermore, the first waveguide layer 1 comprises doping in the region of $1 \times 10^{18}/cm^3$. The first barrier layer 2 and the second barrier layer 4 comprise doping in the region of $4 \times 10^{18}/cm^3$. The first quantum film 3, the second quantum film 5, the last barrier layer 6, and the second waveguide layer 7 are substantially undoped.

FIG. 19 shows a further section of a further embodiment of an optoelectronic component formed from a semiconductor material, in particular from InGaN or AlInGaN. The component comprises an active zone for producing electromagnetic radiation. Here, the component comprises the following layer structure: a first waveguide layer 1, a first barrier layer 2, a first quantum film 3, a second barrier layer 4, a second quantum film 5, a last barrier layer 6, and a second waveguide layer 7. A peculiarity of this embodiment consists of the last barrier layer 6 comprising a smaller bandgap than the second barrier layer 4. Moreover, the second barrier layer 4 comprises a smaller bandgap than the first barrier layer 2. In the depicted embodiment, the layer structure is formed from indium gallium nitride with a varying indium concentration. The first waveguide layer 1 comprises an indium concentration of 1%. The first barrier layer 2 comprises an indium concentration of 2%. The second barrier layer 4 comprises an indium concentration of 4%. The last barrier layer 6 comprises an indium concentration of 6%. The second waveguide layer 7 comprises an indium concentration of 1%. The first quantum film 3 and the second quantum film 5 comprise an indium concentration of 20%. Moreover, the first waveguide layer 1 comprises doping in the region of $1 \times 10^{18}/cm^3$. The first barrier layer 2 comprises doping in the region of $4 \times 10^{18}/cm^3$. The second barrier layer 2 comprises doping in the region of $4 \times 10^{18}/cm^3$. The first quantum film 3, the second quantum film 5, the last barrier layer 6, and the second waveguide layer 7 are undoped. This embodiment also achieves an improvement in the injection of the charge carriers. Moreover, improved wave guidance is facilitated by the configuration of the waveguide layers with indium gallium nitride.

The bandgap of the barrier layers may be reduced depending on the material of the barrier layer, for example, by increasing the indium concentration in the case of indium gallium nitride or by reducing the aluminum concentration in the case of the configuration with aluminum gallium nitride.

The exemplary embodiments described in the figures may be formed from the indium gallium nitride material system or the aluminum gallium nitride material system or from the indium aluminum gallium nitride material system. The indium content or the aluminum content may be set accordingly depending on the desired bandgap or the desired bandgaps for the barrier layers and the waveguide layers.

The values for the doping and the values for the indium content or the bandgaps may vary depending on the selected embodiments.

The invention claimed is:

1. An optoelectronic component comprising:
    an active zone configured to produce electromagnetic radiation, wherein the active zone comprises at least two quantum films, wherein a first quantum film is arranged between a first barrier layer and a second barrier layer, wherein a second quantum film is arranged between the second barrier layer and a last barrier layer, and wherein bandgaps of the first barrier layer and of the second barrier layer are related differently to one another than bandgaps of the second barrier layer and of the last barrier layer, wherein a bandgap of the first barrier layer and a bandgap of the second barrier layer are of approximately equal magnitude, and wherein the last barrier layer comprises a larger bandgap than the second barrier layer.

2. The component according to claim 1, wherein the second barrier layer comprises a higher electrical doping than the first barrier layer and the last barrier layer, and wherein the first barrier layer comprises a higher electrical doping than the last barrier layer.

3. The component according to claim 1, wherein the first barrier layer comprises an electrical doping equal to or lower than an electrical doping of the second barrier layer, or wherein an electrical doping within a barrier layer is arranged in a step-like manner or increases along a thickness of the barrier layer, or wherein an electrical doping within a barrier layer comprises a profile having a symmetric configuration about a center of the barrier layer along a thickness of the barrier layer, and wherein the electrical doping decreases in a direction of an edge region of the barrier layer.

4. The component according to claim 1, wherein the second barrier layer comprises a greater thickness than the first barrier layer and/or the last barrier layer.

5. The component according to claim 1, further comprising:
    at least one further quantum film between the second quantum film and the last barrier layer; and
    a further second barrier layer between the second quantum film and the further quantum film,
    wherein the last barrier layer adjoins the further quantum film, wherein the further second barrier layer is configured in accordance with the second barrier layer or in accordance with the last barrier layer, or wherein the further second barrier layer comprises values in respect of the bandgap and/or an electrical doping which lie between the values of the second barrier layer and the values of the last barrier layer or which are equal to the values of the second barrier layer or of the last barrier layer.

6. The component according to claim 1, wherein the second barrier layer comprises an electrical doping higher than or equal to an electrical doping of the last barrier layer.

7. An optoelectronic component comprising:
    an active zone configured to produce electromagnetic radiation, wherein the active zone comprises at least two quantum films, wherein a first quantum film is arranged between a first barrier layer and a second barrier layer, wherein a second quantum film is arranged between the second barrier layer and a last barrier layer, wherein bandgaps of the first barrier layer and of the second barrier layer are related differently to one another than bandgaps of the second barrier layer and of the last barrier layer,
    wherein the first barrier layer comprises a larger bandgap than the second barrier layer, wherein the second barrier layer comprises a smaller bandgap than the last barrier layer, and wherein the first barrier layer comprises a smaller bandgap than the last barrier layer.

8. The component according to claim 7, wherein the second barrier layer comprises an electrical doping higher than or equal to an electrical doping of the last barrier layer.

9. The component according to claim 7, further comprising:
    at least one further quantum film between the second quantum film and the last barrier layer; and
    a further second barrier layer between the second quantum film and the further quantum film,
    wherein the last barrier layer adjoins the further quantum film, wherein the further second barrier layer is configured in accordance with the second barrier layer or in accordance with the last barrier layer, or wherein the further second barrier layer comprises values in respect of the bandgap and/or an electrical doping which lie between the values of the second barrier layer and the values of the last barrier layer or which are equal to the values of the second barrier layer or of the last barrier layer.

10. An optoelectronic component comprising:
    an active zone configured to produce electromagnetic radiation, wherein the active zone comprises at least two quantum films, wherein a first quantum film is arranged between a first barrier layer and a second barrier layer, wherein a second quantum film is arranged between the second barrier layer and a last barrier layer, wherein bandgaps of the first barrier layer and of the second barrier layer are related differently to one another than bandgaps of the second barrier layer and of the last barrier layer,
    wherein the first barrier layer comprises a greater bandgap than the second barrier layer, wherein the second barrier layer comprises a smaller bandgap than the last barrier layer, and wherein a bandgap of the first barrier layer comprises the same magnitude as or is larger than a bandgap of the last barrier layer.

11. The component according to claim 10, wherein the second barrier layer comprises an electrical doping higher than or equal to an electrical doping of the last barrier layer.

12. The component according to claim 10, wherein the first barrier layer comprises an electrical doping equal to or lower than an electrical doping of the second barrier layer, or wherein an electrical doping within a barrier layer is arranged in a step-like manner or increases along a thickness of the barrier layer, or wherein an electrical doping within a barrier layer comprises a profile having a symmetric configuration about a center of the barrier layer along a thickness of the barrier layer, and wherein the electrical doping decreases in a direction of an edge region of the barrier layer.

13. The component according to claim 10, wherein the second barrier layer comprises a greater thickness than the first barrier layer and/or the last barrier layer.

14. The component according to claim 10, further comprising:
    at least one further quantum film between the second quantum film and the last barrier layer; and
    a further second barrier layer between the second quantum film and the further quantum film, wherein the last barrier layer adjoins the further quantum film, wherein the further second barrier layer is configured in accordance with the second barrier layer or in accordance with the last barrier layer, or wherein the further second barrier layer comprises values in respect of the bandgap and/or an electrical doping which lie between the values of the second barrier layer and the values of the last barrier layer or which are equal to the values of the second barrier layer or of the last barrier layer.

15. An optoelectronic component comprising:
   an active zone configured to produce electromagnetic radiation, wherein the active zone comprises at least two quantum films, wherein a first quantum film is arranged between a first barrier layer and a second barrier layer, wherein a second quantum film is arranged between the second barrier layer and a last barrier layer, wherein bandgaps of the first barrier layer and of the second barrier layer are related differently to one another than bandgaps of the second barrier layer and of the last barrier layer,
   wherein the first barrier layer comprises a smaller bandgap than the second barrier layer, and wherein the second barrier layer comprises a smaller bandgap than the last barrier layer.

16. The component according to claim 15, wherein the second barrier layer comprises an electrical doping higher than or equal to an electrical doping of the last barrier layer.

17. The component according to claim 15, wherein the first barrier layer comprises an electrical doping equal to or lower than an electrical doping of the second barrier layer, or wherein an electrical doping within a barrier layer is arranged in a step-like manner or increases along a thickness of the barrier layer, or wherein an electrical doping within a barrier layer comprises a profile having a symmetric configuration about a center of the barrier layer along a thickness of the barrier layer, and wherein the electrical doping decreases in a direction of an edge region of the barrier layer.

18. The component according to claim 15, wherein the second barrier layer comprises a greater thickness than the first barrier layer and/or the last barrier layer.

19. The component according to claim 15, further comprising:
   at least one further quantum film between the second quantum film and the last barrier layer; and
   a further second barrier layer between the second quantum film and the further quantum film,
   wherein the last barrier layer adjoins the further quantum film, wherein the further second barrier layer is configured in accordance with the second barrier layer or in accordance with the last barrier layer, or wherein the further second barrier layer comprises values in respect of the bandgap and/or an electrical doping which lie between the values of the second barrier layer and the values of the last barrier layer or which are equal to the values of the second barrier layer or of the last barrier layer.

20. An optoelectronic component comprising:
   an active zone configured to produce electromagnetic radiation, wherein the active zone comprises at least two quantum films, wherein a first quantum film is arranged between a first barrier layer and a second barrier layer, wherein a second quantum film is arranged between the second barrier layer and a last barrier layer, wherein bandgaps of the first barrier layer and of the second barrier layer are related differently to one another than bandgaps of the second barrier layer and of the last barrier layer,
   wherein the first barrier layer and/or the second barrier layer comprise/comprises a higher electrical doping than the last barrier layer, and wherein an electrical doping of the first barrier layer and an electrical doping of the second barrier layer are of approximately equal magnitude.

21. The component according to claim 20, wherein the first barrier layer is arranged between a first waveguide layer and the first quantum film, wherein the last barrier layer is arranged between the second quantum film and a second waveguide layer, and wherein the first waveguide layer has a smaller bandgap than the second waveguide layer, or wherein the first barrier layer comprises a larger bandgap than the second barrier layer, and wherein the second waveguide layer comprises a lower bandgap than the last barrier layer.

22. The component according to claim 20, wherein the second barrier layer comprises a greater thickness than the first barrier layer and/or the last barrier layer.

23. The component according to claim 20, further comprising:
   at least one further quantum film between the second quantum film and the last barrier layer; and
   a further second barrier layer between the second quantum film and the further quantum film,
   wherein the last barrier layer adjoins the further quantum film, wherein the further second barrier layer is configured in accordance with the second barrier layer or in accordance with the last barrier layer, or wherein the further second barrier layer comprises values in respect of the bandgap and/or an electrical doping which lie between the values of the second barrier layer and the values of the last barrier layer or which are equal to the values of the second barrier layer or of the last barrier layer.

24. An optoelectronic component comprising:
   an active zone configured to produce electromagnetic radiation, wherein the active zone comprises at least two quantum films, wherein a first quantum film is arranged between a first barrier layer and a second barrier layer, wherein a second quantum film is arranged between the second barrier layer and a last barrier layer, wherein bandgaps of the first barrier layer and of the second barrier layer are related differently to one another than bandgaps of the second barrier layer and of the last barrier layer,
   wherein the first barrier layer comprises a smaller electrical doping than the second barrier layer, and wherein the second barrier layer comprises a higher electrical doping than the last barrier layer.

25. The component according to claim 24, wherein the second barrier layer comprises a greater thickness than the first barrier layer and/or the last barrier layer.

26. The component according to claim 24, further comprising:
   at least one further quantum film between the second quantum film and the last barrier layer; and
   a further second barrier layer between the second quantum film and the further quantum film,
   wherein the last barrier layer adjoins the further quantum film, wherein the further second barrier layer is configured in accordance with the second barrier layer or in accordance with the last barrier layer, or wherein the further second barrier layer comprises values in respect of the bandgap and/or an electrical doping which lie between the values of the second barrier layer and the values of the last barrier layer or which are equal to the values of the second barrier layer or of the last barrier layer.

27. The component according to claim 24, wherein the first barrier layer is arranged between a first waveguide layer and the first quantum film, wherein the last barrier layer is arranged between the second quantum film and a second waveguide layer, and wherein the first waveguide layer has a smaller bandgap than the second waveguide layer, or wherein the first barrier layer comprises a larger bandgap than the second barrier layer, and wherein the second waveguide layer comprises a lower bandgap than the last barrier layer.

* * * * *